United States Patent
Nakagawa et al.

(10) Patent No.: US 10,835,876 B2
(45) Date of Patent: Nov. 17, 2020

(54) GAS-DISSOLVED LIQUID PRODUCING APPARATUS

(71) Applicant: EBARA CORPORATION, Tokyo (JP)

(72) Inventors: Yoichi Nakagawa, Tokyo (JP); Suguru Ozawa, Tokyo (JP); Toshifumi Watanabe, Tokyo (JP); Tao Xu, Tokyo (JP)

(73) Assignee: EBARA CORPORATION, Tokyo (JP)

(*) Notice: Subject to any disclaimer, the term of this patent is extended or adjusted under 35 U.S.C. 154(b) by 217 days.

(21) Appl. No.: 16/225,666

(22) Filed: Dec. 19, 2018

(65) Prior Publication Data

US 2019/0193034 A1    Jun. 27, 2019

(30) Foreign Application Priority Data

Dec. 25, 2017   (JP) .................. 2017-247390

(51) Int. Cl.
| | | |
|---|---|---|
| *B01F 3/04* | (2006.01) | |
| *C02F 1/78* | (2006.01) | |
| *H01L 21/67* | (2006.01) | |
| *G02F 1/13* | (2006.01) | |

(52) U.S. Cl.
CPC ...... *B01F 3/04737* (2013.01); *B01F 3/04439* (2013.01); *C02F 1/78* (2013.01); *B01F 2003/04886* (2013.01); *C02F 2201/782* (2013.01); *C02F 2209/005* (2013.01); *C02F 2209/23* (2013.01); *C02F 2209/40* (2013.01); *C02F 2209/42* (2013.01); *C02F 2303/18* (2013.01); *G02F 2001/1316* (2013.01); *H01L 21/67051* (2013.01)

(58) Field of Classification Search
CPC ............. B01F 3/04737; B01F 3/04439; B01F 2003/04886; B01F 3/04985; B01F 3/04; B01F 15/00149; B01F 2215/0052; C02F 1/78; C02F 2303/18; C02F 2209/23; C02F 2209/005; C02F 2209/42; C02F 2001/1316; C02F 2209/40; C02F 2201/782; H01L 21/67051
See application file for complete search history.

(56) References Cited

U.S. PATENT DOCUMENTS

| | | | | |
|---|---|---|---|---|
| 2017/0282132 | A1* | 10/2017 | Ozawa | ...................... C02F 1/78 |
| 2018/0333686 | A1* | 11/2018 | Nakagawa | .......... B01F 3/04099 |
| 2018/0353911 | A1* | 12/2018 | Nakagawa | .......... B01F 3/04503 |
| 2019/0015801 | A1* | 1/2019 | Ozawa | .................. B01F 3/0446 |

FOREIGN PATENT DOCUMENTS

| | | |
|---|---|---|
| JP | 2007-275744 A | 10/2007 |
| JP | 2019155221 A | * 9/2019 |

* cited by examiner

*Primary Examiner* — Stephen Hobson
(74) *Attorney, Agent, or Firm* — Pearne & Gordon LLP

(57) ABSTRACT

A gas-dissolved liquid producing apparatus 1 includes a gas supply unit 2, a first liquid supply unit 3, a gas-dissolved liquid generator 4, a second liquid generator 20, a second liquid supply unit 21, a flow rate measuring unit 14, and a controller 23. The controller 23 controls the supply amount of the first liquid to be supplied to the gas-dissolved liquid generator 4 according to the flow rate of circulated gas-dissolved liquid measured by the flow rate measuring unit 14. The gas-dissolved liquid generator 4 dissolves gas supplied from the gas supply unit 2 in first liquid supplied from the first liquid supply unit 3 and second liquid supplied from the second liquid supply unit 21 to generate gas-dissolved liquid.

7 Claims, 6 Drawing Sheets

GAS-DISSOLVED LIQUID PRODUCING APPARATUS

BACKGROUND OF THE INVENTION

Field of the Invention

The present invention relates to a gas-dissolved liquid producing apparatus for producing gas-dissolved liquid by reusing circulated gas-dissolved liquid.

Description of the Related Art

Cleaning methods in manufacturing factories for electronic parts such as semiconductor devices and liquid crystals have been recently increasingly improved along with complication of producing processes and miniaturization of circuit patterns. When silicon wafers are cleaned, fine particles, metal contaminants, organic contaminants, etc. adhering to the silicon wafers are removed by using special cleaning liquid (gas-dissolved water) obtained by dissolving high-purity gas in liquid called functional water (for example, ultrapure water).

Gas-dissolved liquid to be used for cleaning is produced in a gas-dissolved water producing apparatus, and supplied to a cleaning apparatus (use point). Typically, gas-dissolved water which has been used for cleaning is discharged from the cleaning apparatus, and it is desirable that the discharged gas-dissolved water is withdrawn and reused. From this viewpoint, there has been hitherto proposed an apparatus for withdrawing and reusing dissolved gas contained in gas-dissolved water discharged from a cleaning apparatus (for example, see Japanese Patent Laid-Open No. 2007-275744).

However, it has not been so much considered for conventional apparatuses that the use amount of gas-dissolved water varies at a use point. For example, in the conventional apparatuses, even when the use amount of the gas-dissolved water at a use point decreases, the supply amount of gas-dissolved water to be supplied from a gas-dissolved water producing apparatus is not changed. Surplus gas-dissolved water has been hitherto discarded from a drain for waste water.

The present invention has been made in view of the above problem, and has an object to provide a gas-dissolved liquid producing apparatus capable of reusing circulated gas-dissolved liquid and preventing surplus gas-dissolved water from being wasted.

SUMMARY OF THE INVENTION

A gas-dissolved liquid producing apparatus according to the present invention comprises: a gas supply unit that supplies gas serving as a raw material of gas-dissolved liquid; a first liquid supply unit that supplies first liquid serving as a raw material of the gas-dissolved liquid; a gas-dissolved liquid generator that dissolves the gas supplied from the gas supply unit in the first liquid supplied from the first liquid supply unit to generate the gas-dissolved liquid; a second liquid generator to which the gas-dissolved liquid generated in the gas-dissolved liquid generator is circulated and supplied to generate second liquid serving as a raw material of the gas-dissolved liquid from the circulated gas-dissolved liquid; a second liquid supply unit that supplies the second liquid generated in the second liquid generator to the gas-dissolved liquid generator; a flow rate measuring unit that measures a flow rate of the circulated gas-dissolved liquid supplied to the second liquid generator; and a controller that controls the first liquid supply unit and the second liquid supply unit, wherein the controller controls a supply amount of the first liquid to be supplied to the gas-dissolved liquid generator according to the flow rate of the circulated gas-dissolved liquid measured by the flow rate measuring unit, and the gas-dissolved liquid generator dissolves the gas supplied from the gas supply unit in the first liquid supplied from the first liquid supply unit and the second liquid supplied from the second liquid supply unit to generate the gas-dissolved liquid.

According to the foregoing configuration, the gas-dissolved liquid generated in the gas-dissolved liquid generator is circulated and supplied to the second liquid generator to generate the second liquid serving as a raw material of the gas-dissolved liquid from the circulated gas-dissolved liquid. The second liquid generated in the second liquid generator is supplied from the second liquid supply unit to the gas-dissolved liquid generator and reused for generation of the gas-dissolved liquid. In this case, the flow rate of the circulated gas-dissolved liquid is measured by the flow rate measuring unit, and the supply amount (flow rate) of the first liquid to be supplied to the gas-dissolved liquid generator is controlled according to the measured flow rate of the gas-dissolved liquid. That is, the supply amount of the first liquid to be supplied to the gas-dissolved liquid generator is controlled in consideration of the flow rate of the circulated gas-dissolved liquid. Accordingly, for example, when the use amount of the gas-dissolved liquid at the use point decreases, the supply amount of the first liquid to be supplied to the gas-dissolved liquid generator can be reduced, which makes it possible to prevent excessive production of gas-dissolved liquid, eliminate the need to discard surplus gas-dissolved liquid, and prevent a raw material (first liquid) of the gas-dissolved liquid from being wasted.

The gas-dissolved liquid producing apparatus according to the present invention may further comprise a gas-dissolved liquid reservoir that stores the circulated gas-dissolved liquid, and a liquid level measuring unit that measures a height of a liquid level of the gas-dissolved liquid stored in the gas-dissolved liquid reservoir, and the controller may control whether to actuate the second liquid supply unit based on the height of the liquid level of the gas-dissolved liquid measured by the liquid level measuring unit.

According to the foregoing configuration, the second liquid supply unit can be appropriately actuated according to the height of the liquid level of the gas-dissolved liquid measured by the liquid level measuring unit. For example, when the height of the liquid level of the gas-dissolved liquid measured by the liquid level measuring unit is equal to or higher than a predetermined reference height, the second liquid has been sufficiently supplied to the second liquid supply unit, and thus there would be no problem even when the second liquid supply unit is actuated. On the other hand, when the height of the liquid level of the gas-dissolved liquid measured by the liquid level measuring unit has not reached the predetermined reference height, the second liquid has not yet been sufficiently supplied to the second liquid supply unit, and this condition is not suitable for actuation of the second liquid supply unit.

In the gas-dissolved liquid producing apparatus according to the present invention, the second liquid generator may subject the circulated gas-dissolved liquid to a thermal decomposition treatment or a photolysis treatment to generate the second liquid from the gas-dissolved liquid.

According to the foregoing configuration, the second liquid can be easily generated from the gas-dissolved liquid by subjecting the circulated gas-dissolved liquid to the thermal decomposition treatment or the photolysis treatment.

In the gas-dissolved liquid producing apparatus according to the present invention, the second liquid generator may subject the circulated gas-dissolved liquid to a degasification treatment to generate the second liquid from the gas-dissolved liquid.

According to the foregoing configuration, the second liquid can be easily generated from the gas-dissolved liquid by subjecting the circulated gas-dissolved liquid to the degasification treatment.

In the gas-dissolved liquid producing apparatus according to the present invention, the gas-dissolved liquid that has been generated in the gas-dissolved liquid generator and supplied to an outside of the gas-dissolved liquid producing apparatus may be circulated outside the gas-dissolved liquid producing apparatus and then supplied to the second liquid generator.

According to the foregoing configuration, the gas-dissolved liquid generated in the gas-dissolved liquid generator is supplied to the outside of the gas-dissolved liquid producing apparatus, circulated outside the gas-dissolved liquid producing apparatus, and then supplied to the second liquid generator. This makes it possible to generate the second liquid serving as a raw material of the gas-dissolved liquid from the gas-dissolved liquid circulated outside the gas-dissolved producing apparatus, and reuse the second liquid for generation of the gas-dissolved liquid.

In the gas-dissolved liquid producing apparatus according to the present invention, the gas-dissolved liquid that has been generated in the gas-dissolved liquid generator and has not been supplied to an outside of the gas-dissolved liquid producing apparatus is circulated inside the gas-dissolved liquid producing apparatus and supplied to the second liquid generator.

According to the foregoing configuration, the gas-dissolved liquid generated in the gas-dissolved liquid generator is not supplied to the outside of the gas-dissolved liquid producing apparatus, but circulated inside the gas-dissolved liquid producing apparatus and supplied to the second liquid generator. As a result, the second liquid serving as a raw material of the gas-dissolved liquid can be generated from the gas-dissolved liquid circulated inside the gas-dissolved liquid producing apparatus, and reused for generation of the gas-dissolved liquid.

A gas-dissolved liquid producing method according to the present invention is implemented in a gas-dissolved liquid producing apparatus, the gas-dissolved liquid producing apparatus including a gas supply unit that supplies gas serving as a raw material of gas-dissolved liquid, a first liquid supply unit that supplies first liquid serving as a raw material of the gas-dissolved liquid, a gas-dissolved liquid generator that dissolves the gas supplied from the gas supply unit in the first liquid supplied from the first liquid supply unit to generate the gas-dissolved liquid, a second liquid generator to which the gas-dissolved liquid generated in the gas-dissolved liquid generator is circulated and supplied to generate second liquid serving as a raw material of the gas-dissolved liquid from the circulated gas-dissolved liquid, a second liquid supply unit that supplies the second liquid generated in the second liquid generator to the gas-dissolved liquid generator, a flow rate measuring unit that measures a flow rate of the circulated gas-dissolved liquid supplied to the second liquid generator, and a controller that controls the first liquid supply unit and the second liquid supply unit, and the producing method comprises: controlling, by the controller, a supply amount of the first liquid to be supplied to the gas-dissolved liquid generator according to a flow rate of the circulated gas-dissolved liquid measured by the flow rate measuring unit; and dissolving, by the gas-dissolved liquid generator, the gas supplied from the gas supply unit in the first liquid supplied from the first liquid supply unit and the second liquid supplied from the second liquid supply unit to generate the gas-dissolved liquid.

According to the producing method, as in the case of the foregoing gas-dissolved liquid producing apparatus, the gas-dissolved liquid generated in the gas-dissolved liquid generator is circulated and supplied to the second liquid generator to generate the second liquid serving as a raw material of the gas-dissolved liquid from the circulated gas-dissolved liquid. The second liquid generated in the second liquid generator is supplied from the second liquid supply unit to the gas-dissolved liquid generator and reused for generation of the gas-dissolved liquid. In this case, the flow rate of the circulated gas-dissolved liquid is measured by the flow rate measuring unit, and the supply amount (flow rate) of the first liquid to be supplied to the gas-dissolved liquid generator is controlled according to the measured flow rate of the gas-dissolved liquid. That is, the supply amount of the first liquid to be supplied to the gas-dissolved liquid generator is controlled in consideration of the flow rate of the circulated gas-dissolved liquid. Accordingly, for example, when the use amount of the gas-dissolved liquid at the use point decreases, the supply amount of the first liquid to be supplied to the gas-dissolved liquid generator can be reduced. This makes it possible to prevent excessive production of the gas-dissolved liquid, eliminate the need to discard the surplus gas-dissolved liquid, and eliminate the raw material (first liquid) of the gas-dissolved liquid from being wasted.

According to the present invention, it is possible to reuse the circulated gas-dissolved liquid, and eliminate the need to discard surplus gas-dissolved liquid.

DETAILED DESCRIPTION OF THE PREFERRED EMBODIMENTS

A gas-dissolved liquid producing apparatus according to an embodiment of the present invention will be described hereinafter with reference to the drawings. The present embodiment will be described while exemplifying a gas-dissolved liquid producing apparatus used in manufacturing factories for electronic parts such as semiconductor devices and liquid crystals. Furthermore, the present embodiment will be described in a case of an ozonated water producing apparatus for dissolving ozone in pure water to produce ozonated water.

Figure 1:
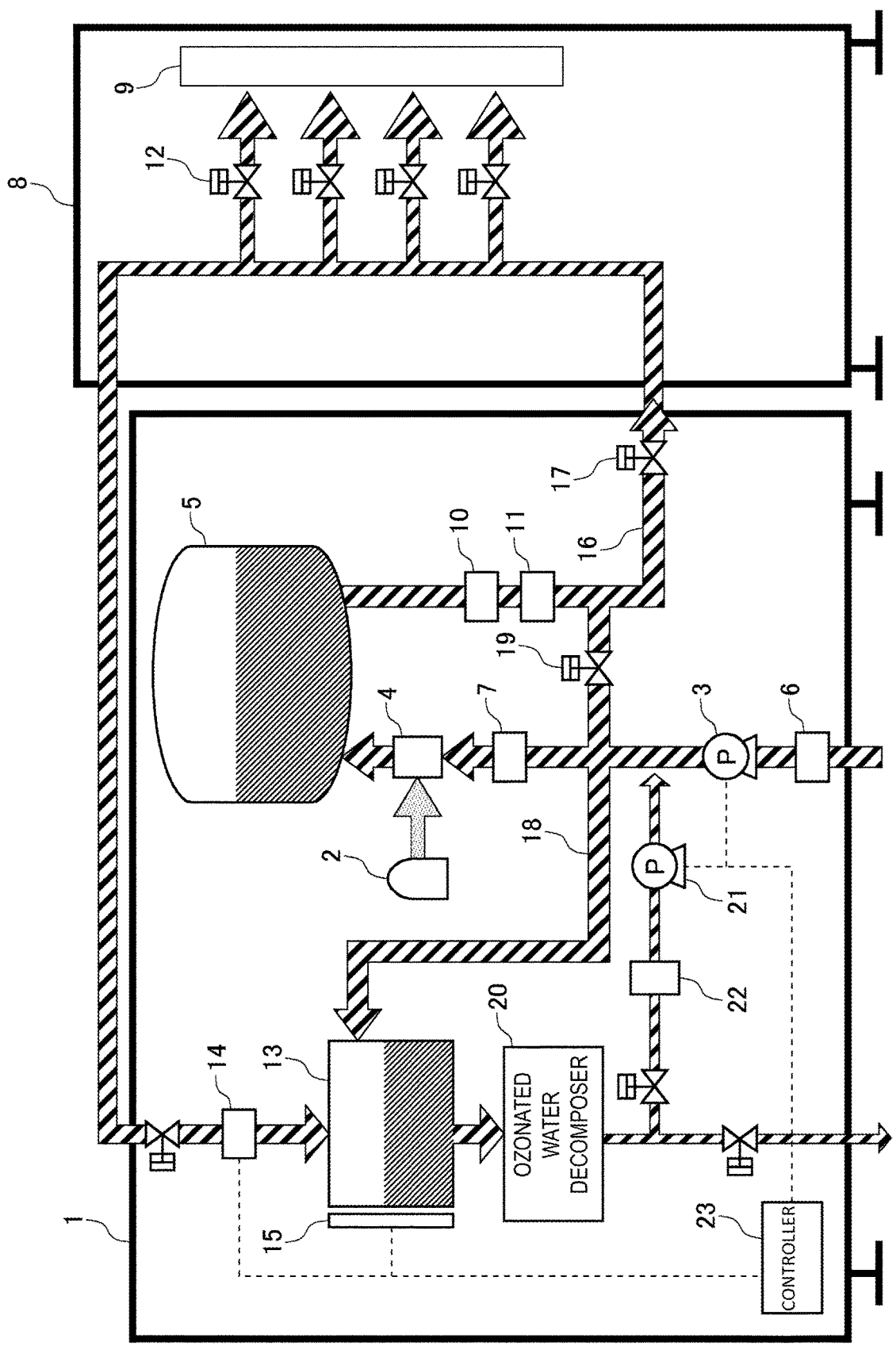
FIG. 1 is an explanatory diagram showing a gas-dissolved liquid producing apparatus according to an embodiment of the present invention.

A configuration of a gas-dissolved liquid producing apparatus (ozonated water producing apparatus) according to an embodiment of the present invention will be described with reference to the drawings. FIG. 1 is an explanatory diagram of the ozonated water producing apparatus according to the present embodiment. As shown in FIG. 1, the ozonated water producing apparatus 1 includes a gas supply unit 2 for supplying ozone (gas) serving as a raw material of ozonated water, a first pump 3 for supplying pure water (first liquid) serving as a raw material of ozonated water, an ozonated water generator 4 for dissolving the ozone supplied from the gas supply unit 2 into the pure water supplied from the first pump 3 to produce ozonated water, and a gas-liquid separation tank 5 in which the ozonated water produced in the ozonated water generator 4 is stored. In addition, a first flowmeter 6 for measuring the flow rate of pure water supplied to the first pump 3 is provided on the upstream side of the first pump 3, and a second flowmeter 7 for measuring the flow rate of pure water supplied to the ozonated water generator 4 is provided on the upstream side of the ozonated water generator 4 (between the first pump 3 and the ozonated water generator 4).

The ozonated water stored in the gas-liquid separation tank 5 is provided to a use point 9 (a cleaning unit, etc.) of an ozonated water using apparatus 8. A concentration meter 10 for measuring the concentration of ozonated water supplied to the ozonated water using apparatus 8, and a third flowmeter 11 for measuring the flow rate of ozonated water supplied to the ozonated water using apparatus 8 are provided on the downstream side of the gas-liquid separation tank 5. The ozonated water using apparatus 8 is provided with a valve group 12 that is opened and closed according to the use amount of ozonated water at the use point 9.

The ozonated water produced in the ozonated water producing apparatus 1 is circulated through the ozonated water using apparatus 8 outside the ozonated water producing apparatus 1, and then returned to the ozonated water producing apparatus 1. The ozonated water producing apparatus 1 includes a circulated ozonated water tank 13 for storing ozonated water circulated through the ozonated water using apparatus 8 outside the ozonated water producing apparatus 1. The circulated ozonated water tank 13 is provided with a fourth flowmeter 14 for measuring the flow rate of the ozonated water which has been circulated through the ozonated water using apparatus 8 outside the ozonated water producing apparatus 1 and returned to the ozonated water producing apparatus 1. The circulated ozonated water tank 13 is also provided with a liquid level sensor 15 for measuring the height of the liquid level of the ozonated water stored in the circulated ozonated water tank 13.

The ozonated water producing apparatus 1 is configured so as to be capable of circulating ozonated water inside the ozonated water producing apparatus 1. In this case, the ozonated water producing apparatus 1 includes a first valve 17 provided in a supply line 16 for supplying ozonated water stored in the gas-liquid separation tank 5 to the ozonated water using apparatus 8 outside the ozonated water producing apparatus 1, and a second valve 19 provided in a circulation line 18 for circulating ozonated water stored in the gas-liquid separation tank 5 inside the ozonated water producing apparatus 1. By setting the first valve 17 to an open state and also setting the second valve 19 to a closed state, the ozonated water produced in the ozonated water producing apparatus 1 can be supplied to the ozonated water using apparatus 8 outside the ozonated water producing apparatus 1. On the other hand, by setting the first valve 17 to a closed state and also setting the second valve 19 to an open state, the ozonated water produced in the ozonated water producing apparatus 1 can be circulated inside the ozonated water producing apparatus 1. The circulated ozonated water tank 13 is capable of storing the ozonated water circulated inside the ozonated water producing apparatus 1.

The ozonated water producing apparatus 1 further includes an ozonated water decomposer 20 to which the ozonated water stored in the circulated ozonated water tank 13 is supplied. The ozonated water decomposer 20 subjects the ozonated water supplied from the circulated ozonated water tank 13 to a thermal decomposition treatment or a photolysis treatment to decompose ozone contained in the ozonated water into oxygen and produce oxygen water (second liquid) from the ozonated water. Publicly known methods can be used for the thermal decomposition treatment or the photolysis treatment. It is to be noted that the oxygen water may mainly contain oxygen, and may contain other gases other than oxygen (for example, ozone whose concentration is little to the extent that it cannot be detected by a detector), a metal component, or the like. Hereinafter, water containing oxygen as a main component will be referred to as "oxygen water". It is needless to say that the oxygen water may be pure oxygen water.

The ozonated water producing apparatus 1 further includes a second pump 21 for supplying the oxygen water produced in the ozonated water decomposer 20 to the ozonated water generator 4, and a fifth flowmeter 22 for measuring the flow rate of the oxygen water supplied to the second pump 21. The ozonated water generator 4 may dissolve ozone supplied from the gas supply unit 2 into pure water supplied from the first pump 3 and oxygen water supplied from the second pump 21 to generate ozonated water. In this case, even when ozonated water is generated by using, as a raw material, liquid obtained by mixing oxygen water with pure water, the solubility of ozone to the liquid is not greatly affected. Furthermore, the concentration of oxygen contained in ozonated water has no significant effect even at the use point 9.

The ozonated water producing apparatus 1 includes a controller 23 for controlling the first pump 3 and the second pump 21. The controller 23 has a function of controlling the supply amount (flow rate) of pure water to be supplied from the first pump 3 to the ozonated water generator 4 according to the flow rate of ozonated water (ozonated water circulated outside the ozonated water producing apparatus 1) measured by the fourth flowmeter 14. In addition, the controller 23 has a function of controlling whether to actuate the second pump 21 based on the height of the liquid level of ozonated water in the circulated ozonated water tank 13 which is measured by the liquid level sensor 15.

The operation of the ozonated water producing apparatus 1 will be described hereinafter with reference to the drawings. Here, an operation at the start-up time of the ozonated water producing apparatus 1, an operation at the start time of use of ozonated water at the use point 9 (the use amount of ozonated water at the use point 9 is equal to 20 L/min), an operation at the variation time of the use amount of ozonated water at the use point 9 (variation from 20 L/min to 10 L/min), and an operation at the maintenance time at the use point 9 will be successively described in this order.

(Operation at the Start-Up Time of the Ozonated Water Producing Apparatus)

Figure 2:
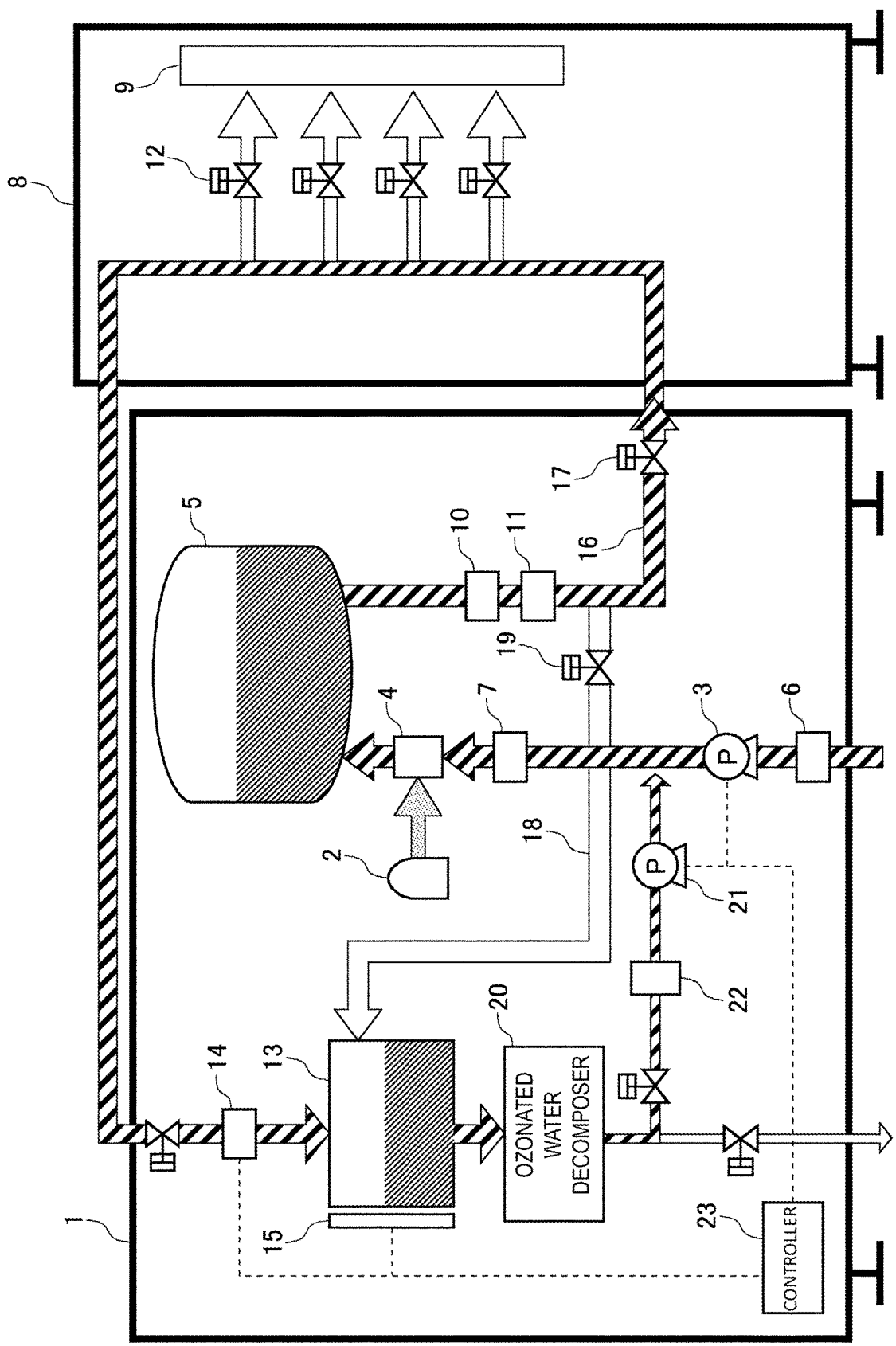
FIG. 2 is an explanatory diagram showing the gas-dissolved liquid producing apparatus according to the embodiment of the present invention (when the apparatus is started up)

FIG. 2 is an explanatory diagram showing an operation at the start-up time of the ozonated water producing apparatus 1. As shown in FIG. 2, when the ozonated water producing apparatus 1 is started up, the gas supply unit 2 is actuated to supply ozone to the ozonated water generator 4, and also the first pump 3 is actuated to supply pure water to the ozonated water generator 4. At this time, the controller 23 controls the first pump 3 to supply pure water to the ozonated water generator 4 at the flow rate of 25 L/min larger than a scheduled use amount of ozonated water of 20 L/min at the use point 9.

The ozonated water generator 4 dissolves ozone supplied from the gas supply unit 2 into pure water supplied from the first pump 3 to generate ozonated water. The generated ozonated water is supplied to the gas-liquid separation tank 5 to perform gas-liquid separation.

When the ozonated water producing apparatus 1 is started up, the first valve 17 is set to the open state, and the second valve 19 is set to the closed state, so that the ozonated water stored in the gas-liquid separation tank 5 is supplied to the ozonated water using apparatus 8 outside the ozonated water producing apparatus 1. However, it takes some time until the ozone concentration of ozonated water to be produced becomes stable, and thus the ozone concentration of the ozonated water is not stable at the start-up time of the ozonated water producing apparatus 1. Therefore, at the start-up time of the ozonated water producing apparatus 1, all the valves of the valve group 12 of the ozonated water using apparatus 8 are set to the closed state so that no ozonated water is supplied to the use point 9.

In this case, the ozonated water supplied to the ozonated water using apparatus 8 is not supplied to the use point 9, but the ozonated water is circulated through the ozonated water using apparatus 8 and then returned to the ozonated water producing apparatus 1. In this case, the flow rate of the ozonated water to be returned to the ozonated water producing apparatus 1 is equal to 25 L/min. The ozonated water returned to the ozonated water producing apparatus 1 is stored in the circulated ozonated water tank 13. The ozonated water stored in the circulated ozonated water tank 13 is supplied to the ozonated water decomposer 20 to generate oxygen water from the ozonated water.

When a predetermined time has elapsed since the start-up of the ozonated water producing apparatus 1 and the liquid level sensor 15 detects that the height of the liquid level of the ozonated water in the circulated ozonated water tank 13 has reached a predetermined reference height or more, the controller 23 starts to actuate the second pump 21, and oxygen water generated in the ozonated water decomposer 20 is supplied from the second pump 21 to the ozonated water generator 4. It is to be noted that the liquid level sensor 15 is not necessarily required. When there is any sensor capable of detecting a state where a line on a downstream side from the circulated ozonated water tank 13 to the second pump 21 is filled with liquid, the liquid level sensor 15 of the circulated ozonated water tank 13 is unnecessary.

As the time elapses, the supply amount of oxygen water by the second pump 21 is gradually increased while the supply amount of pure water by the first pump 3 is decreased. Finally, the supply amount of oxygen water by the second pump 21 is increased to 25 L/min, and the supply amount of pure water by the first pump 3 is decreased to 0 L/min, and the first pump 3 is stopped. In the ozonated water generator 4, the ozonated water is generated by using the oxygen water supplied from the second pump 21 and/or the pure water supplied from the first pump 3 as raw materials. The ozone concentration of the generated ozonated water is measured by the concentration meter 10, and when the ozone concentration of the ozonated water becomes stable, the start-up of the ozonated water producing apparatus 1 is completed.

(Operation at the Start Time of Use at the Use Point)

Figure 3:
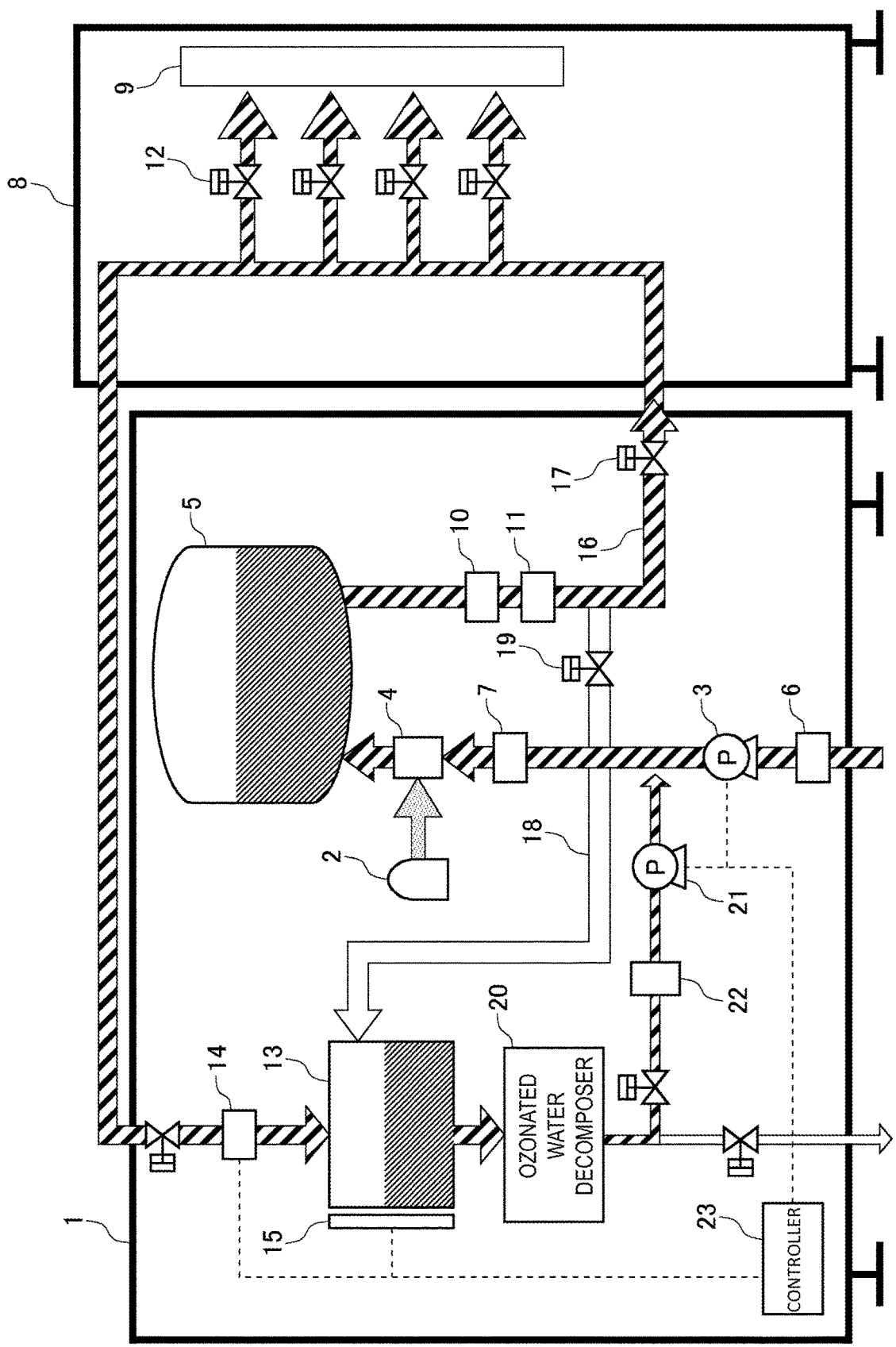
FIG. 3 is an explanatory diagram showing the gas-dissolved liquid producing apparatus according to the embodiment of the present invention (when use at a use point is started)

FIG. 3 is an explanatory diagram showing an operation at the start time of use of ozonated water at the use point 9. As shown in FIG. 3, when use of ozonated water at the use point 9 is started, the valve group 12 of the ozonated water using apparatus 8 is set to the open state. For example, all the valves of the valve group 12 are set to the open state. At this time, the use amount of ozonated water at the use point 9 is equal to 20 L/min.

When the valve group 12 of the ozonated water using apparatus 8 is set to the open state, the flow rate of ozonated water circulated through the ozonated water using apparatus 8 and returned to the ozonated water producing apparatus 1 decreases. For example, when all the valves of the valve group 12 of the ozonated water using apparatus 8 are set to the open state and the ozonated water at the flow rate of 20 L/min is used at the use point 9, the flow rate of ozonated water returned to the ozonated water producing apparatus 1 decreases (from 25 L/min) to 5 L/min.

When the controller 23 detects through the fourth flowmeter 14 that the flow rate of the ozonated water returned to the ozonated water producing apparatus 1 has decreased to 5 L/min (decreased by only the amount corresponding to 20 L/min used at the use point 9), the controller 23 actuates the first pump 3 to supply pure water of the reduced amount (20 L/min) to the ozonated water generator 4. As described above, the ozonated water producing apparatus 1 can stably produce ozonated water of 20 L/min of the scheduled use amount and supply the ozonated water to the use point 9.

(Variation of Use Amount at Use Point)

Figure 4:
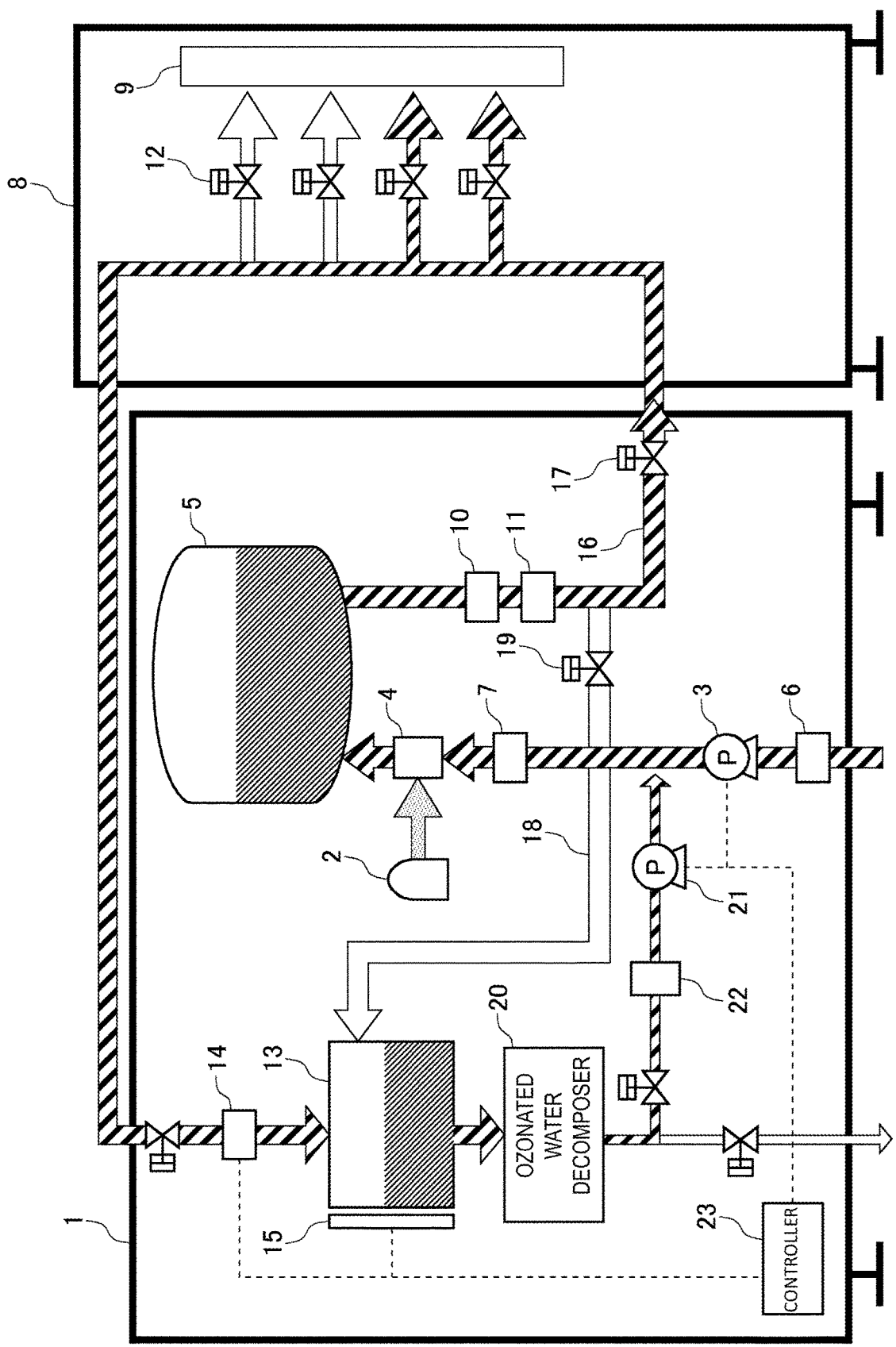
FIG. 4 is an explanatory diagram showing the gas-dissolved liquid producing apparatus according to the embodiment of the present invention (when a use amount at the use point varies)

FIG. 4 is an explanatory diagram when the use amount of ozonated water at the use point 9 varies. As shown in FIG. 4, when the use amount of ozonated water at the use point 9 decreases, a part of the valve group 12 of the ozonated water using apparatus 8 is set to the closed state. For example, a half number of the valves of the valve group 12 are set to the closed state. At this time, the use amount of ozonated water at the use point 9 is equal to 10 L/min.

When a part of the valve group 12 of the ozonated water using apparatus 8 is set to the closed state, the flow rate of the ozonated water circulated through the ozonated water using apparatus 8 and returned to the ozonated water producing apparatus 1 increases. For example, when a half number of the valves of the valve group 12 of the ozonated water using apparatus 8 are set to the closed state and thus the flow rate of the ozonated water used at the use point 9 varies to 10 L/min, the flow rate of the ozonated water returned to the ozonated water producing apparatus 1 increases (from 5 L/min) to 15 L/min.

When the controller 23 detects through the fourth flowmeter 14 that the flow rate of the ozonated water returned to the ozonated water producing apparatus 1 has increased to 15 L/min (has increased by only the amount corresponding to 10 L/min used at the use point 9), the controller 23 controls the first pump 3 to reduce the supply amount of pure water to be supplied to the ozonated water generator 4 (from 20 L/min) to 10 L/min. As described above, the ozonated water producing apparatus 1 can produce ozonated water according to the variation of the use amount of ozonated water at the use point 9 and supply the ozonated water to the use point 9.

(Operation at the Maintenance Time at the Use Point)

Figure 5:
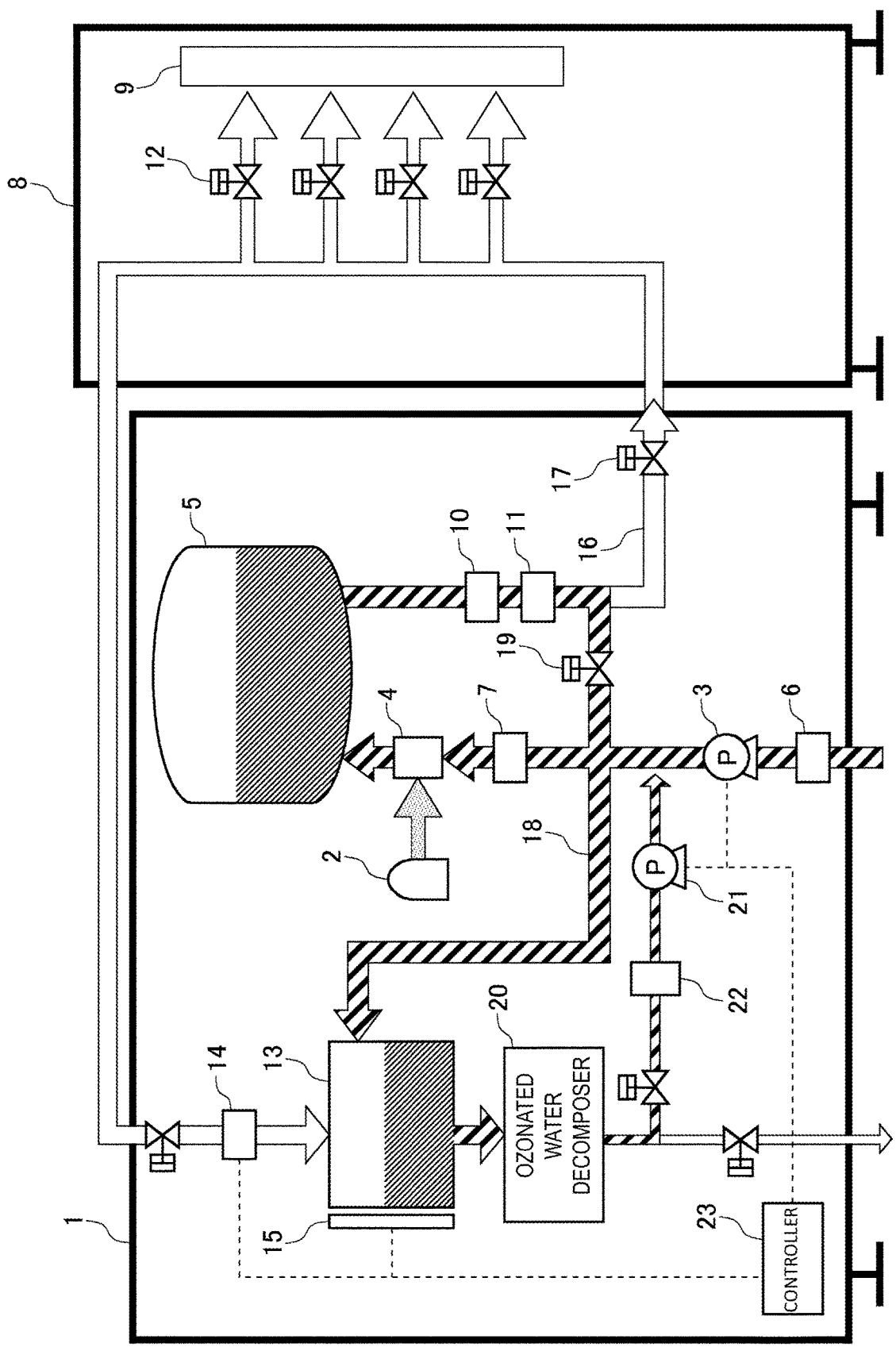
FIG. 5 is an explanatory diagram showing the gas-dissolved liquid producing apparatus according to the embodiment of the present invention (at the time of maintenance at the use point)

FIG. 5 is an explanatory diagram showing an operation at the maintenance time of the ozonated water using apparatus 8. As shown in FIG. 5, at the maintenance time of the ozonated water using apparatus 8, the first valve 17 is set to the closed state and the second valve 19 is set to the open state so that no ozonated water is supplied to the ozonated water using apparatus 8.

In this case, the ozonated water produced in the ozonated water producing apparatus 1 is not supplied to the ozonated water using apparatus 8, but the ozonated water is circulated through the ozonated water producing apparatus 1 and stored in the circulated ozonated water tank 13. The ozonated water stored in the circulated ozonated water tank 13 is supplied to the ozonated water decomposer 20, and oxygen water is generated from the ozonated water. The oxygen water generated in the ozonated water decomposer 20 is supplied from the second pump 21 to the ozonated water generator 4. In the ozonated water generator 4, ozonated water is generated by using oxygen water supplied from the second pump 21 and/or pure water supplied from the first pump 3 as raw materials.

It is also possible to start up the ozonated water producing apparatus 1 by performing the same operation as the operation at the maintenance time of the ozonated water using apparatus 8. In that case, regardless of the ozonated water using apparatus 8, it is possible to start up the apparatus by only the ozonated water producing apparatus 1 (alone). Furthermore, ozonated water can be also circulated inside the ozonated water producing apparatus 1 at the maintenance time of the ozonated water using apparatus 8, so that ozonated water can be continuously produced in the ozonated water producing apparatus 1. As a result, it is possible to shorten the start-up time after the maintenance is completed.

According to the ozonated water producing apparatus 1 of the present embodiment as described above, ozonated water generated in the ozonated water generator 4 is circulated and supplied to the ozonated water decomposer 20, and oxygen water (second liquid) serving as a raw material of ozonated water is generated from the circulated ozonated water. The oxygen water generated in the ozonated water decomposer 20 is supplied from the second pump 21 to the ozonated water generator 4 and reused for generating ozonated water.

In this case, the flow rate of the circulated ozonated water is measured by the fourth sensor, and the supply amount (flow rate) of pure water (first liquid) to be supplied to the ozonated water generator 4 is controlled according to the measured flow rate of the ozonated water. That is, the supply amount of pure water to be supplied to the ozonated water generator 4 is controlled in consideration of the flow rate of the circulated ozonated water. Accordingly, for example, when the use amount of ozonated water at the use point 9 decreases, the supply amount of pure water to be supplied to the ozonated water generator 4 can be reduced, which makes it possible to prevent excessive production of ozonated water, eliminate the need to discard surplus ozonated water, and prevent the raw material (pure water) of ozonated water from being wasted.

Furthermore, in the present embodiment, the second pump 21 can be appropriately actuated according to the height of the liquid level of the ozonated water in the circulated ozonated water tank 13 which is measured by the liquid level sensor 15. For example, when the height of the liquid level of the ozonated water measured by the liquid level sensor 15 is equal to or higher than a predetermined reference height, oxygen water has been sufficiently supplied to the second pump 21, so that no problem would occur even when the second pump 21 is actuated. On the other hand, when the height of the liquid level of the ozonated water measured by the liquid level sensor 15 has not reached the predetermined reference height, oxygen water has not been sufficiently supplied to the second pump 21, and this condition is not suitable for operating the second pump 21.

In the present embodiment, the circulated ozonated water is subjected to a thermal decomposition treatment or a photolysis treatment by using the ozonated water decomposer 20, whereby oxygen water can be easily generated from the ozonated water.

Furthermore, in the present embodiment, ozonated water generated in the ozonated water generator 4 is supplied to the outside of the ozonated water producing apparatus 1, circulated outside the ozonated water producing apparatus 1, and then supplied to the ozonated water decomposer 20. This makes it possible to generate oxygen water serving as a raw material of ozonated water from the ozonated water circulated outside the ozonated water producing apparatus 1, and reuse the oxygen water for generation of ozonated water.

Furthermore, in the present embodiment, the ozonated water generated in the ozonated water generator 4 is not supplied to the outside of the ozonated water producing apparatus 1, but the ozonated water is circulated inside the ozonated water producing apparatus 1 and supplied to the ozonated water decomposer 20. This makes it possible to generate oxygen water serving as a raw material of ozonated water from the ozonated water circulated inside the ozonated water producing apparatus 1 and reuse the oxygen water for generation of ozonated water.

The embodiment of the present invention has been described by way of exemplification. However, the scope of the present invention is not limited to the embodiment, and the embodiment may be altered and modified according to purposes within the scope recited in the claims.

Figure 6:
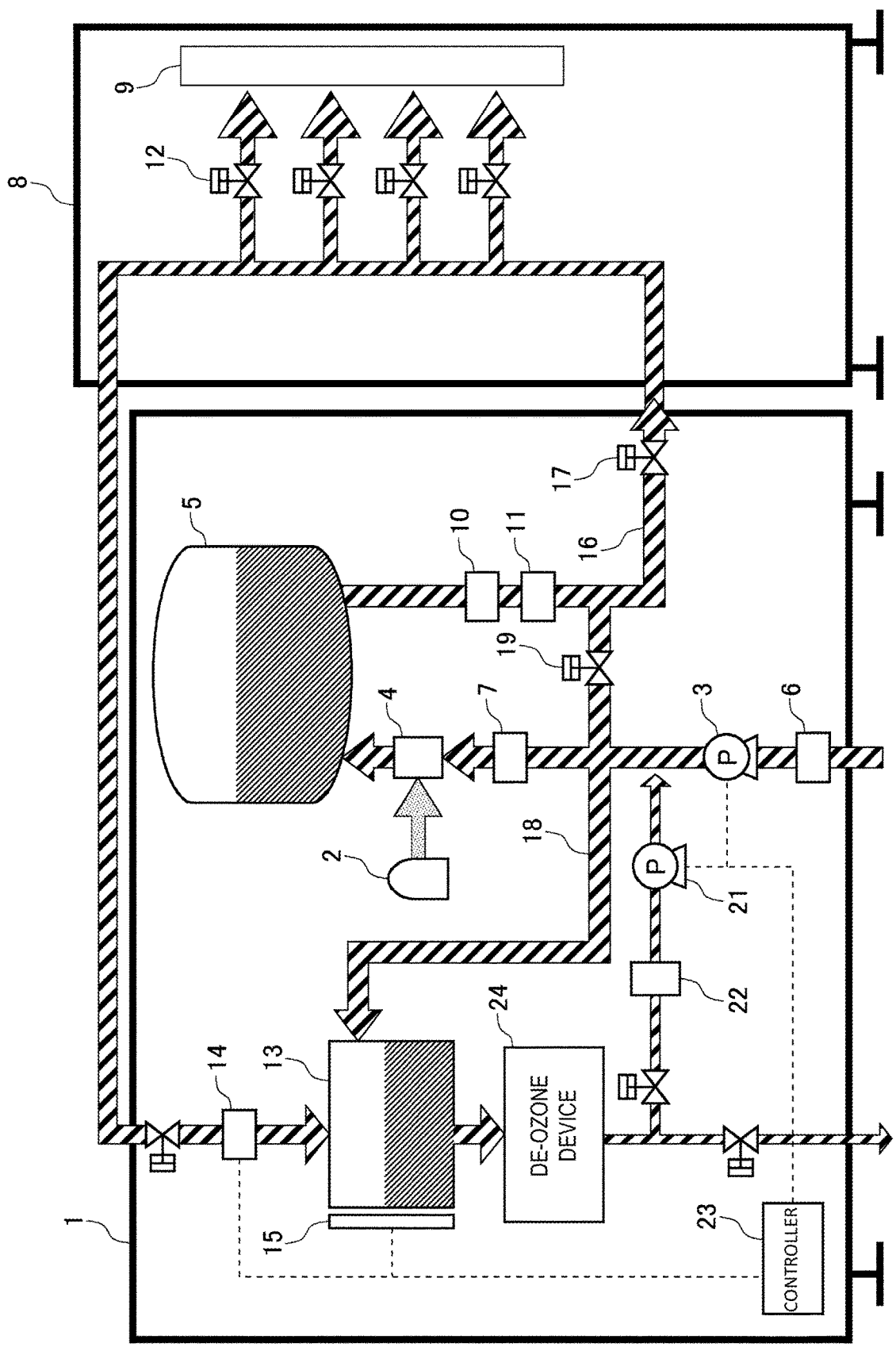
FIG. 6 is an explanatory diagram showing a gas-dissolved liquid producing apparatus according to another embodiment.

For example, the foregoing description has been made on an example using the ozonated water decomposer 20 for subjecting circulated ozonated water to the thermal decomposition treatment or the photolysis treatment to generate oxygen water from the ozonated water. However, the scope of the present invention is not limited to the above example. For example, there may be used a de-ozone device 24 that subjects circulated ozonated water to a degasification treatment to generate pure water (second liquid) from the ozonated water as shown in FIG. 6. In this case, pure water can be easily produced from ozonated water by subjecting circulated ozonated water to the degasification treatment with the de-ozone device 24. It is to be noted that the pure water generated from the ozonated water by the de-ozone device 24 may contain other gases (oxygen and nitrogen) and metal components. Also, ozone may be contained insofar as the concentration of ozone is extremely low (for example, a concentration undetectable by a detector).

Furthermore, the foregoing description has been made on the apparatus for dissolving ozone in pure water to produce ozonated water. However, the scope of the present invention is not limited to the foregoing apparatus. For example, the present invention may be likewise implemented on apparatuses for dissolving another gas in another liquid to produce gas-dissolved liquid such as an apparatus for dissolving carbon dioxide in pure water to produce carbonated water, an apparatus for dissolving hydrogen in pure water to produce hydrogen water, etc.

As described above, the gas-dissolved liquid producing apparatus according to the present invention has an effect of enabling reuse of circulated gas-dissolved liquid and enabling elimination of the need to discard surplus gas-dissolved liquid, and is usable and useful in manufacturing factories for electronic parts such as semiconductor devices and liquid crystals.

DESCRIPTION OF REFERENCE SIGNS

1 Ozonated water producing apparatus (gas-dissolved liquid producing apparatus)
2 gas supply unit
3 first pump (first liquid supply unit)
4 ozonated water generator (gas-dissolved liquid generator)
5 gas-liquid separation tank
6 first flowmeter
7 second flowmeter
8 ozonated water using apparatus
9 use point
10 concentration meter
11 third flowmeter
12 valve group
13 circulated ozonated water tank (gas-dissolved liquid reservoir)
14 fourth flowmeter (flow rate measuring unit)
15 liquid level sensor (liquid level measuring unit)
16 supply line
17 first valve
18 circulation line
19 second valve
20 ozonated water decomposer (second liquid generator)
21 second pump (second liquid supply unit)
22 fifth flowmeter
23 controller
24 de-ozone device (second liquid generator)

What is claimed is:

1. A gas-dissolved liquid producing apparatus comprising:
a gas supply unit that supplies gas serving as a raw material of gas-dissolved liquid;
a first liquid supply unit that supplies a first liquid serving as a raw material of the gas-dissolved liquid;
a gas-dissolved liquid generator that dissolves the gas supplied from the gas supply unit in the first liquid supplied from the first liquid supply unit to generate the gas-dissolved liquid;
a second liquid generator to which the gas-dissolved liquid generated in the gas-dissolved liquid generator is circulated and supplied to generate a second liquid serving as a raw material of the gas-dissolved liquid from the circulated gas-dissolved liquid;
a second liquid supply unit that supplies the second liquid generated in the second liquid generator to the gas-dissolved liquid generator;
a flow rate measuring unit that measures a flow rate of the circulated gas-dissolved liquid supplied to the second liquid generator; and
a controller that controls the first liquid supply unit and the second liquid supply unit, wherein
the controller controls a supply amount of the first liquid to be supplied to the gas-dissolved liquid generator according to the flow rate of the circulated gas-dissolved liquid measured by the flow rate measuring unit, and
the gas-dissolved liquid generator dissolves the gas supplied from the gas supply unit in the first liquid supplied from the first liquid supply unit and the second liquid supplied from the second liquid supply unit to generate the gas-dissolved liquid.

2. The gas-dissolved liquid producing apparatus according to claim 1, further comprising:
a gas-dissolved liquid reservoir that stores the circulated gas-dissolved liquid; and
a liquid level measuring unit that measures a height of a liquid level of the gas-dissolved liquid stored in the gas-dissolved liquid reservoir, wherein
the controller controls whether to actuate the second liquid supply unit based on the height of the liquid level of the gas-dissolved liquid measured by the liquid level measuring unit.

3. The gas-dissolved liquid producing apparatus according to claim 1, wherein the second liquid generator subjects the circulated gas-dissolved liquid to a thermal decomposition treatment or a photolysis treatment to generate the second liquid from the gas-dissolved liquid.

4. The gas-dissolved liquid producing apparatus according to claim 1, wherein the second liquid generator subjects the circulated gas-dissolved liquid to a degasification treatment to generate the second liquid from the gas-dissolved liquid.

5. The gas-dissolved liquid producing apparatus according to claim 1, wherein the gas-dissolved liquid that has been generated in the gas-dissolved liquid generator and supplied to an outside of the gas-dissolved liquid producing apparatus is circulated outside the gas-dissolved liquid producing apparatus and then supplied to the second liquid generator.

6. The gas-dissolved liquid producing apparatus according to claim 1, wherein the gas-dissolved liquid that has been generated in the gas-dissolved liquid generator and has not been supplied to an outside of the gas-dissolved liquid producing apparatus is circulated inside the gas-dissolved liquid producing apparatus and supplied to the second liquid generator.

7. A gas-dissolved liquid producing method implemented in a gas-dissolved liquid producing apparatus, the gas-dissolved liquid producing apparatus including
a gas supply unit that supplies gas serving as a raw material of gas-dissolved liquid;
a first liquid supply unit that supplies a first liquid serving as a raw material of the gas-dissolved liquid;
a gas-dissolved liquid generator that dissolves the gas supplied from the gas supply unit in the first liquid supplied from the first liquid supply unit to generate the gas-dissolved liquid;
a second liquid generator to which the gas-dissolved liquid generated in the gas-dissolved liquid generator is circulated and supplied to a generate second liquid serving as a raw material of the gas-dissolved liquid from the circulated gas-dissolved liquid;
a second liquid supply unit that supplies the second liquid generated in the second liquid generator to the gas-dissolved liquid generator;
a flow rate measuring unit that measures a flow rate of the circulated gas-dissolved liquid supplied to the second liquid generator; and
a controller that controls the first liquid supply unit and the second liquid supply unit, the producing method comprising:
controlling, by the controller, a supply amount of the first liquid to be supplied to the gas-dissolved liquid generator according to a flow rate of the circulated gas-dissolved liquid measured by the flow rate measuring unit; and dissolving, by the gas-dissolved liquid generator, the gas supplied from the gas supply unit in the first liquid supplied from the first liquid supply unit and the second liquid supplied from the second liquid supply unit to generate the gas-dissolved liquid.

\* \* \* \* \*